(12) United States Patent
Takei

(10) Patent No.: US 7,756,496 B2
(45) Date of Patent: Jul. 13, 2010

(54) OSCILLATION CONTROLLING APPARATUS, RECORDING MEDIUM HAVING PROGRAM RECORDED THEREON, AND CHANNEL SELECTING APPARATUS

(75) Inventor: Youji Takei, Kumagaya (JP)

(73) Assignee: Sanyo Electric Co., Ltd., Osaka (JP)

( * ) Notice: Subject to any disclaimer, the term of this patent is extended or adjusted under 35 U.S.C. 154(b) by 737 days.

(21) Appl. No.: 11/734,755

(22) Filed: Apr. 12, 2007

(65) Prior Publication Data

US 2007/0243834 A1 Oct. 18, 2007

(30) Foreign Application Priority Data

Apr. 13, 2006 (JP) ............................. 2006-110879

(51) Int. Cl.
H04B 1/18 (2006.01)
(52) U.S. Cl. ................. 455/179.1; 455/196.1; 455/208; 455/255; 455/258
(58) Field of Classification Search ............. 455/179.1, 455/196.1, 208, 255, 258, 146–147, 188.1, 455/209, 230, 236.1, 259, 264, 265, 315–316, 455/318
See application file for complete search history.

(56) References Cited

U.S. PATENT DOCUMENTS

| 7,432,769 | B2 * | 10/2008 | Kato et al. ..................... 331/34 |
| 7,486,148 | B2 * | 2/2009 | May ............................. 331/34 |
| 7,587,184 | B2 * | 9/2009 | Der et al. .................. 455/173.1 |
| 2003/0040292 | A1 * | 2/2003 | Peterzell et al. ............. 455/147 |
| 2003/0087621 | A1 * | 5/2003 | Roeckner et al. ............ 455/295 |
| 2003/0134609 | A1 * | 7/2003 | Kasperkovitz et al. ....... 455/255 |
| 2004/0048594 | A1 * | 3/2004 | Okanobu ..................... 455/324 |
| 2006/0199555 | A1 * | 9/2006 | Ikeda et al. ............... 455/165.1 |
| 2008/0002788 | A1 * | 1/2008 | Akhtar et al. ............... 375/298 |
| 2010/0009645 | A1 * | 1/2010 | Der et al. .................. 455/173.1 |

FOREIGN PATENT DOCUMENTS

JP 2002-111527 4/2002

* cited by examiner

Primary Examiner—Pablo N Tran
(74) Attorney, Agent, or Firm—SoCal IP Law Group LLP; Steven C. Sereboff; John E. Gunther

(57) ABSTRACT

An oscillation controlling apparatus for controlling an oscillation frequency of an oscillation circuit to be a target frequency comprises a variable range dividing unit configured to dividing a variable range of a control signal into a plurality of portions, the control signal increasing or decreasing the oscillation frequency of the oscillation circuit as a value thereof is increased or decreased; and a determining unit configured to determining the portion including the control signal setting the oscillation frequency to the target frequency, by outputting the control signal at a boundary of each portion divided by the variable range dividing unit and by acquiring the oscillation frequency of the oscillation circuit, wherein the variable range dividing unit is configured to divide repeatedly the variable range until the oscillation frequency of the oscillation circuit is set to the target frequency with using the portion determined by the determining unit as the variable range.

19 Claims, 5 Drawing Sheets

OSCILLATION CONTROLLING APPARATUS, RECORDING MEDIUM HAVING PROGRAM RECORDED THEREON, AND CHANNEL SELECTING APPARATUS

CROSS-REFERENCE TO RELATED APPLICATION

This application claims the benefit of priority to Japanese Patent Application No. 2006-110879, filed Apr. 13, 2006, of which full contents are incorporated herein by reference.

BACKGROUND OF THE INVENTION

1. Field of the Invention

The present invention relates to an oscillation controlling apparatus, a recording medium having a program recorded thereon, and a channel selecting apparatus.

2. Description of the Related Art

In FM radio receivers, AM radio receivers, etc., oscillation circuits are used to extract signals of desired broadcast stations from received signals and to convert received signals into intermediate frequency signals. Such an oscillation circuit includes a coil, a capacitor, and a varicap (variable-capacitance diode), for example. Capacitances of the capacitor and varicap are changed in accordance with a value of a control signal input from a microcomputer, etc., and the oscillation frequency of the oscillation circuit is changed into a target frequency to extract a signal of a desired broadcast station and to convert a signal into an intermediate frequency signal (e.g., Japanese Patent Application Laid-Open Publication No. 2002-111527).

In the oscillation circuit changing capacitances of the capacitor, varicap, etc., to adjust an oscillation frequency, due to effects of temperature characteristics and manufacturing variances, the value of the control signal cannot be set in advance to set the oscillation frequency to the target frequency. Therefore, the value of the control signal must be obtained to set the oscillation frequency to the target frequency at the timing of changing the oscillation frequency.

In one method of obtaining the value of the control signal corresponding to the target frequency, the value of the control signal is changed stepwise within a variable range to obtain the value of the control signal setting the oscillation frequency to the target frequency.

However, since the value of the control signal is changed stepwise in this method, it takes very long time to obtain the value of the control signal corresponding to the target frequency.

In another method of obtaining the value of the control signal corresponding to the target frequency, linear approximation is used. In the method using linear approximation, an approximate line showing the frequency characteristic of the oscillation frequency is obtained based on oscillation frequencies of two appropriate values of the control signal. An approximate value of the control signal corresponding to the target frequency is obtained in accordance with this approximate line. The value of the control signal is then changed near the approximate value to obtain the control signal corresponding to the target frequency.

However, the characteristic of the oscillation frequency in the oscillation circuit is a curve such as a quadratic curve, and the approximate value of the control signal obtained from the approximate line may differ greatly from the value of the control signal corresponding to the target frequency. Therefore, a large range must be defined for changing the control signal near the approximate value of the control signal, and it takes long time to obtain the value of the control signal corresponding to the target frequency.

SUMMARY OF THE INVENTION

The present invention was conceived in view of the above problems and it is therefore the object of the present invention to provide an oscillation controlling apparatus, recording medium having program recorded thereon, and channel selecting apparatus which are able to set the oscillation frequency to the target frequency quickly.

In order to achieve the above object, according to an aspect of the present invention there is provided an oscillation controlling apparatus configured to control an oscillation frequency of an oscillation circuit to be a target frequency, comprising: a variable range dividing unit configured to divide a variable range of a control signal into a plurality of portions, the control signal increasing or decreasing the oscillation frequency of the oscillation circuit as a value thereof is increased or decreased; and a determining unit configured to determine the portion including the control signal setting the oscillation frequency to the target frequency, by outputting the control signal at a boundary of each portion divided by the variable range dividing unit and by acquiring the oscillation frequency of the oscillation circuit, wherein the variable range dividing unit is configured to divide repeatedly the variable range until the oscillation frequency of the oscillation circuit is set to the target frequency with using the portion determined by the determining unit as the variable range.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

=Overall Configuration=

Figure 1:
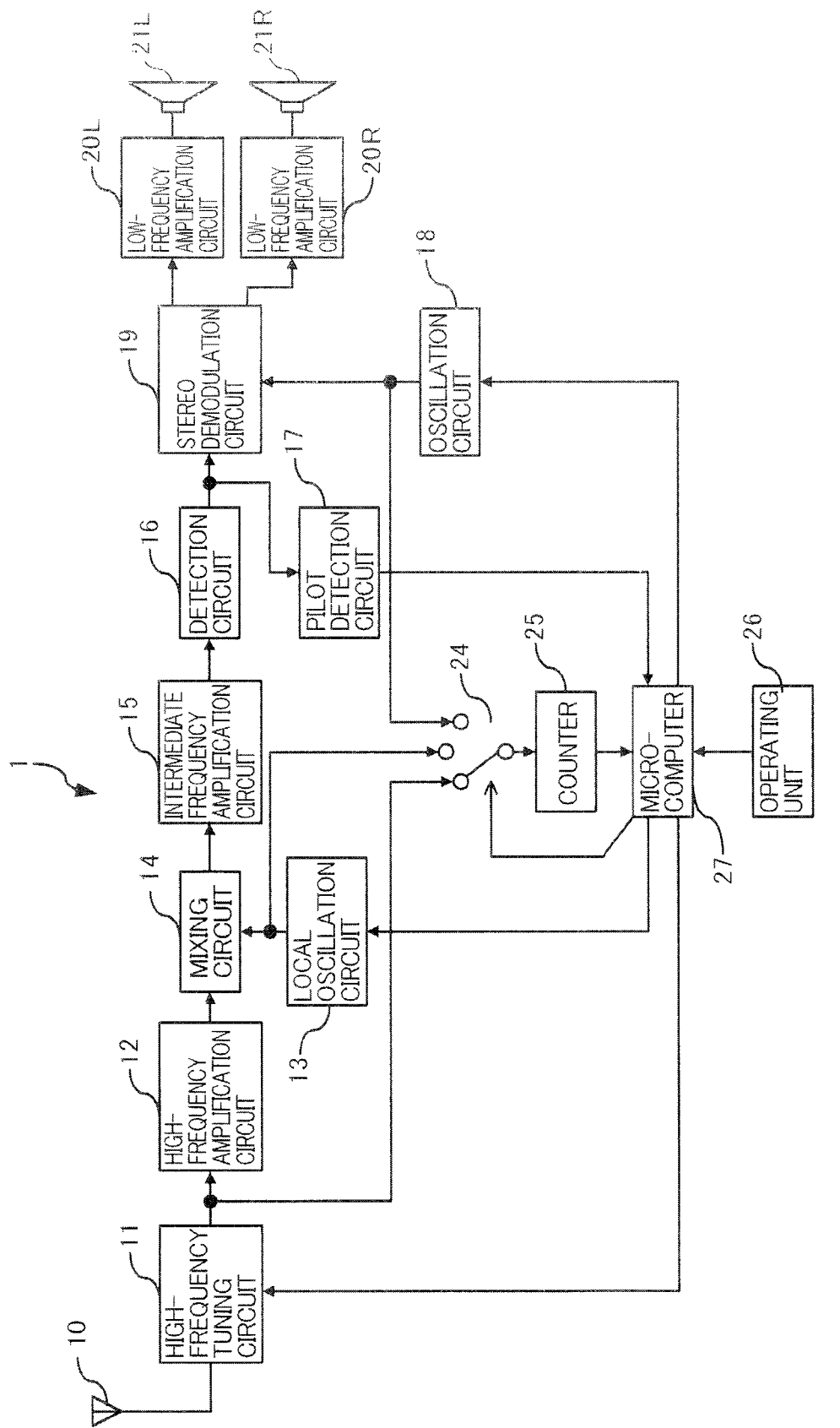
FIG. 1 is a diagram of a configuration example of an FM radio receiver that is an embodiment of the present invention.

FIG. 1 is a diagram of a configuration example of an FM radio receiver that is an embodiment of the present invention. An FM radio receiver 1 includes an antenna 10, a high-frequency tuning circuit 11, a high-frequency amplification circuit 12, a local oscillation circuit 13, a mixing circuit 14, an intermediate frequency amplification circuit 15, a detection circuit 16, a pilot detection circuit 17, an oscillation circuit 18, a stereo demodulation circuit 19, low-frequency amplification circuits 20L, 20R, speakers 21L, 21R, a switch circuit 24, a counter 25, an operating unit 26, and a microcomputer 27. The FM radio receiver 1 corresponds to a channel selecting apparatus of the present invention, and the microcomputer 27 corresponds to an oscillation controlling apparatus of the present invention.

The high-frequency tuning circuit 11 performs tuning operation to extract a reception signal having a desired reception frequency fr from FM reception signals input to the antenna 10. The high-frequency tuning circuit 11 controls a tuning frequency to be fr based on a control signal input from the microcomputer 27. The high-frequency amplification circuit 12 amplifies and outputs the signal having the reception frequency output from the high-frequency tuning circuit 11.

The local oscillation circuit 13 outputs a local oscillation signal having a frequency higher than the reception frequency fr by a predetermined intermediate frequency fi (e.g., 10.7 MHz). The local oscillation circuit 13 controls the frequency of the local oscillation signal to be fr+fi based on the control signal input from the microcomputer 27.

The mixing circuit 14 mixes the reception signal having the frequency fr output from the high-frequency amplification circuit 12 and the local oscillation signal having the frequency fr+fi output from the local oscillation circuit 13 to output a signal corresponding to a difference component. The intermediate frequency amplification circuit 15 amplifies the signal output from the mixing circuit 14 and allows passage of only a frequency component near the predetermined intermediate frequency fi to generate an intermediate frequency signal.

The detection circuit 16 performs a detection process for the intermediate frequency signal output from the intermediate frequency amplification circuit 15 to convert the signal into a stereo composite signal. The stereo composite signal is synthesized from an L-signal (left audio signal) component, an R-signal (right audio signal) component, and, for example, a 19-kHz pilot signal.

The pilot detection circuit 17 detects the frequency of the pilot signal included in the stereo composite signal output from the detection circuit 16. The frequency of the pilot signal is detected by the pilot detection circuit 17 and input to the microcomputer 27.

The oscillation circuit 18 outputs a signal having a frequency (e.g., 456 kHz obtained by multiplying 19 kHz by 24) corresponding to the frequency (e.g., 19 kHz) of the pilot signal. The oscillation circuit 18 performs control to generate the oscillation frequency corresponding to the frequency of the pilot signal based on the control signal input from the microcomputer 27.

From the signal output from the oscillation circuit 18 and having the frequency (e.g., 456 kHz) corresponding to the frequency of the pilot signal, the stereo demodulation circuit 19 generates a subcarrier signal having a frequency (e.g., 38 kHz) obtained by doubling the frequency of the pilot signal, for example. The stereo demodulation circuit 19 loads the stereo composite signal output from the detection circuit 16 in synchronization with the subcarrier signal to pick up and output the L-signal and the R-signal from the stereo composite signal.

The low-frequency amplification circuit 20L amplifies the L-signal output from the stereo demodulation circuit 19 and outputs the L-signal to the speaker 21L. The low-frequency amplification circuit 20R amplifies the R-signal output from the stereo demodulation circuit 19 and outputs the R-signal to the speaker 21R.

Under the control of the microcomputer 27, the switch circuit 24 selects a signal output from any one of the high-frequency tuning circuit 11, the local oscillation circuit 13, and the oscillation circuit 18 and outputs the signal to the counter 25. The counter 25 counts and outputs a number of times of oscillation of an input signal within a predetermined time.

The operating unit 26 is used by a user for selecting a desired reception frequency and is, for example, a dial-type or button-type frequency input apparatus.

The microcomputer 27 outputs a control signal for controlling the oscillation frequencies of the high-frequency tuning circuit 11, the local oscillation circuit 13, and the oscillation circuit 18. When controlling the oscillation frequency of the high-frequency tuning circuit 11, the microcomputer 27 switches the switch circuit 24 toward the high-frequency tuning circuit 11 and acquires the output of the counter 25. The microcomputer 27 changes and outputs the control signal to the high-frequency tuning circuit 11 such that the counted number output from the counter 25 becomes a counted number indicating the reception frequency selected by the operating unit 26. When controlling the oscillation frequency of the local oscillation circuit 13, the microcomputer 27 switches the switch circuit 24 toward the local oscillation circuit 13 and acquires the output of the counter 25. The microcomputer 27 changes and outputs the control signal to the local oscillation circuit 13 such that the counted number output from the counter 25 becomes a counted number indicating a frequency obtained by adding the intermediate frequency to the reception frequency selected by the operating unit 26. When controlling the oscillation frequency of the oscillation circuit 18, the microcomputer 27 switches the switch circuit 24 toward the oscillation circuit 18 and acquires the output of the counter 25. The microcomputer 27 changes and outputs the control signal to the oscillation circuit 18 such that the counted number output from the counter 25 becomes a counted number indicating a frequency (e.g., 456 kHz) corresponding to the frequency of the pilot signal.

=Detailed Configuration=

Figure 2:
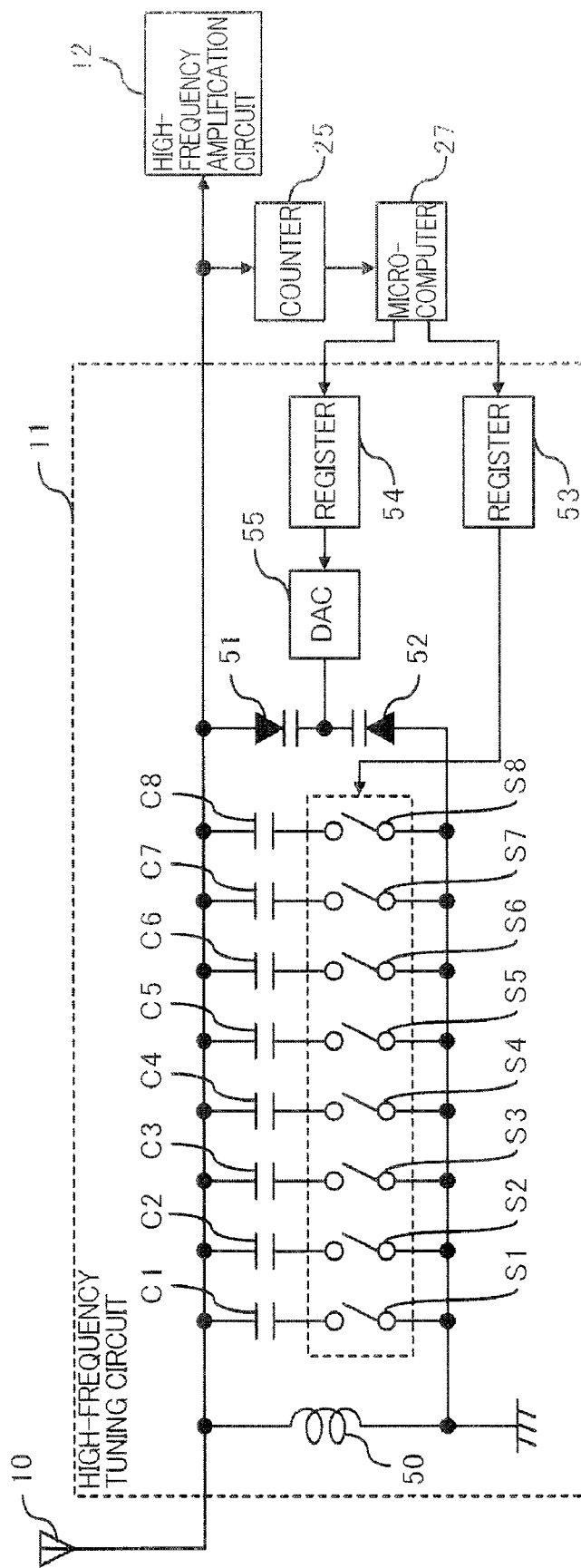
FIG. 2 is a diagram of a configuration example of a high-frequency tuning circuit.

Detailed configurations of the high-frequency tuning circuit 11, the local oscillation circuit 13, and the oscillation circuit 18 will be described. FIG. 2 is a diagram of a configuration example of the high-frequency tuning circuit 11. The high-frequency tuning circuit 11 includes an inductor 50, capacitors C1 to C8, switch circuits S1 to S8, varicaps (variable-capacitance diodes) 51, 52, registers 53, 54, and a DA converter (DAC) 55. The high-frequency tuning circuit 11 is a tuning circuit with the inductor 50, the capacitors C1 to C8, and the varicaps 51, 52 connected in parallel and can adjust a tuning frequency with changes in capacitances of the capacitors and changes in capacitances of the varicaps 51, 52 due to turning on/off of the switch circuits S1 to S8.

The registers 53, 54 are, for example, eight-bit storage circuits and store the control signal output from the microcomputer 27. In this embodiment, the control signal is eight bits.

The switch circuits S1 to S8 are turned on/off in accordance with a value of each bit of the control signal output from the register 53. In this embodiment, each one of the switch circuits S1 to S8 is turned on if corresponding bit of the control signal is "0" and is turned off if corresponding bit of the control signal is "1".

Therefore, for example, if the control signal is 0x00 (0x indicates hexadecimal expression), all the switch circuits S1 to S8 are turned on; if the control signal is 0x01, only the switch circuit S8 is turned off and the switch circuits S1 to S7 are turned on; and if the control signal is 0xFF, all the switch circuits S1 to S8 are turned off.

In the high-frequency tuning circuit 11, when all the switch circuits S1 to S8 are turned on, the composite capacitance of the capacitors C1 to C8 is maximized and the tuning frequency is minimized. When all the switch circuits S1 to S8 are turned off, the composite capacitance of the capacitors C1 to C8 is minimized and the tuning frequency is maximized. The variable range of the tuning frequency due to turning on/off of the switch circuits S1 to S8 can be on the order of 75 MHz to 110 MHz, for example.

The DAC 55 changes the control signal output from the register 54 into a reverse bias voltage, which is output and applied to the varicaps 51, 52. If the voltage output from the DAC 55 is decreased, the capacitances of the varicaps 51, 52 are increased and the tuning frequency is decreased. On the other hand, if the voltage output from the DAC 55 is increased, the capacitances of the varicaps 51, 52 are decreased and the tuning frequency is increased.

In an embodiment, the voltage output from the DAC 55 changes in proportion to the control signal output from the register 54. Therefore, the tuning frequency is decreased as the value of the control signal is decreased, and the tuning frequency is increased as the value of the control signal is increased. The variable width of the tuning frequency due to the changes in capacitances of the varicaps 51, 52 can be on the order of 1 MHz.

In this high-frequency tuning circuit 11, under the control of the microcomputer 27, the control signal set in the register 53 is adjusted to drive the tuning frequency to the vicinity of the desired reception frequency. Under the control of the microcomputer 27, the control signal set in the register 54 is then adjusted to set the tuning frequency to the reception frequency. For example, if the desired reception frequency is 80.0 MHz, the tuning frequency is adjusted on the order of 79.5 MHz to 80.5 MHz by the control signal set in the register 53 and the tuning frequency is finely adjusted to become 80.0 MHz by the control signal set in the register 54.

Figure 3:
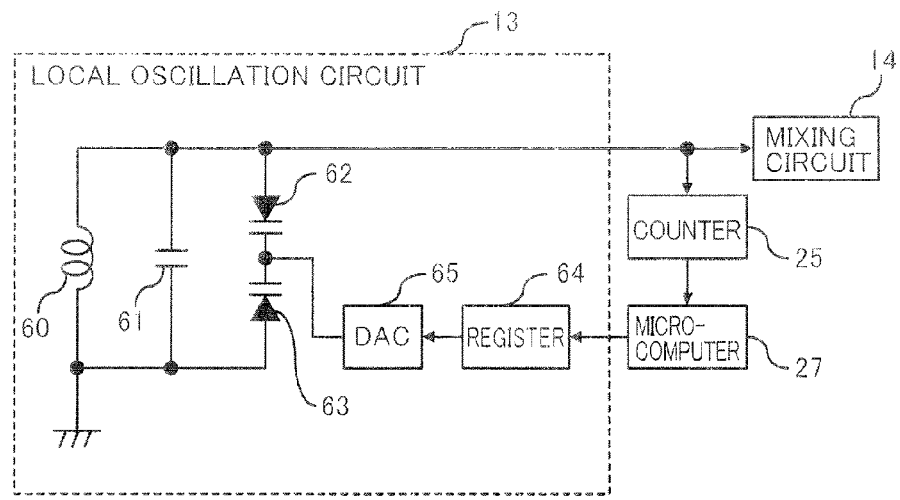
FIG. 3 is a diagram of a configuration example of a local oscillation circuit.

FIG. 3 is a diagram of a configuration example of the local oscillation circuit 13. The local oscillation circuit 13 includes an inductor 60, a capacitor 61, varicaps 62, 63, a register 64, and a DAC 65. The local oscillation circuit 13 is a tuning circuit with the inductor 60, the capacitor 61, and the varicaps 62, 63 connected in parallel and can adjust an oscillation frequency with changes in capacitances of the varicaps 62, 63.

The register 64 is, for example, eight-bit storage circuits and stores the control signal output from the microcomputer 27.

The DAC 65 changes the control signal output from the register 64 into a reverse bias voltage, which is output and applied to the varicaps 62, 63. If the voltage output from the DAC 65 is decreased, the capacitances of the varicaps 62, 63 are increased and the oscillation frequency is decreased. On the other hand, if the voltage output from the DAC 65 is increased, the capacitances of the varicaps 62, 63 are decreased and the oscillation frequency is increased.

In an embodiment, the voltage output from the DAC 65 changes in proportion to the control signal output from the register 64. Therefore, the oscillation frequency is decreased as the value of the control signal is decreased, and the oscillation frequency is increased as the value of the control signal is increased.

Figure 4:
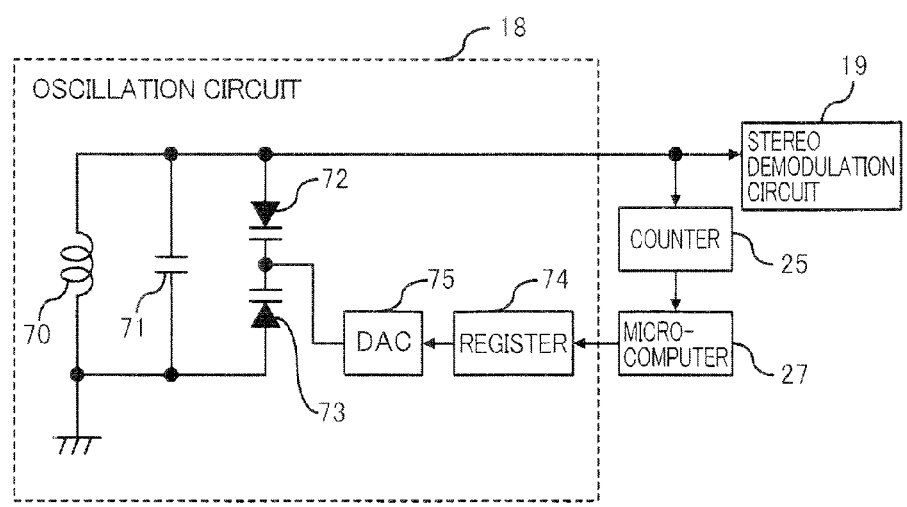
FIG. 4 is a diagram of a configuration example of an oscillation circuit.

FIG. 4 is a diagram of a configuration example of the oscillation circuit 18. The oscillation circuit 18 includes an inductor 70, a capacitor 71, varicaps 72, 73, a register 74, and a DAC 75. Details of the units 70 to 75 are the same as the units 60 to 64 of the local oscillation circuit 13.

The local oscillation circuit 13 and the oscillation circuit 18 can also be configured such that the capacitances of the capacitors 61, 71 are changed in accordance with the control signal as is the case with the high-frequency tuning circuit 11.

Figure 5:
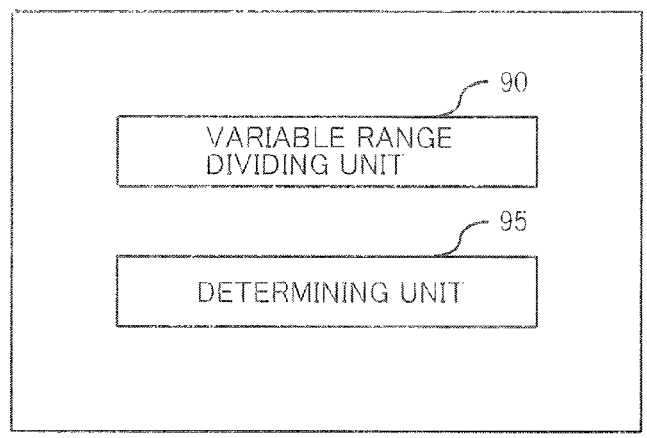
FIG. 5 is a diagram of a configuration of a functional block realized by a microcomputer.

FIG. 5 is a diagram of a configuration of a functional block realized by the microcomputer 27. The microcomputer 27 includes a variable range dividing unit 90 and a determining unit 95. The units 90, 95 are realized by executing programs stored in a memory such as ROM (Read Only Memory) in the microcomputer 27 with a processor (not shown) in the microcomputer 27.

The variable range dividing unit 90 divides the variable range of the control signal into a plurality of blocks (portions). Since the control signal is eight bits in this embodiment, the default value of the variable range of the control signal is 0x00 to 0xFF.

The determining unit 95 outputs a control signal of a boundary of each block divided by the variable range dividing unit 90 and acquires the oscillation frequencies of the high-frequency tuning circuit 11, the local oscillation circuit 13, and the oscillation circuit 18. The determining unit 95 determines a block including the control signal setting the oscillation frequency of the oscillation circuit to the target frequency.

The variable range dividing unit 90 uses the block determined by the determining unit 95 as a variable range and repeatedly divides the variable range until the oscillation frequency of the oscillation circuit is set to the target frequency. As a result, the value of the control signal is identified which sets the oscillation frequency of the oscillation circuit to the target frequency.

=Description of Operation=

Figure 6:
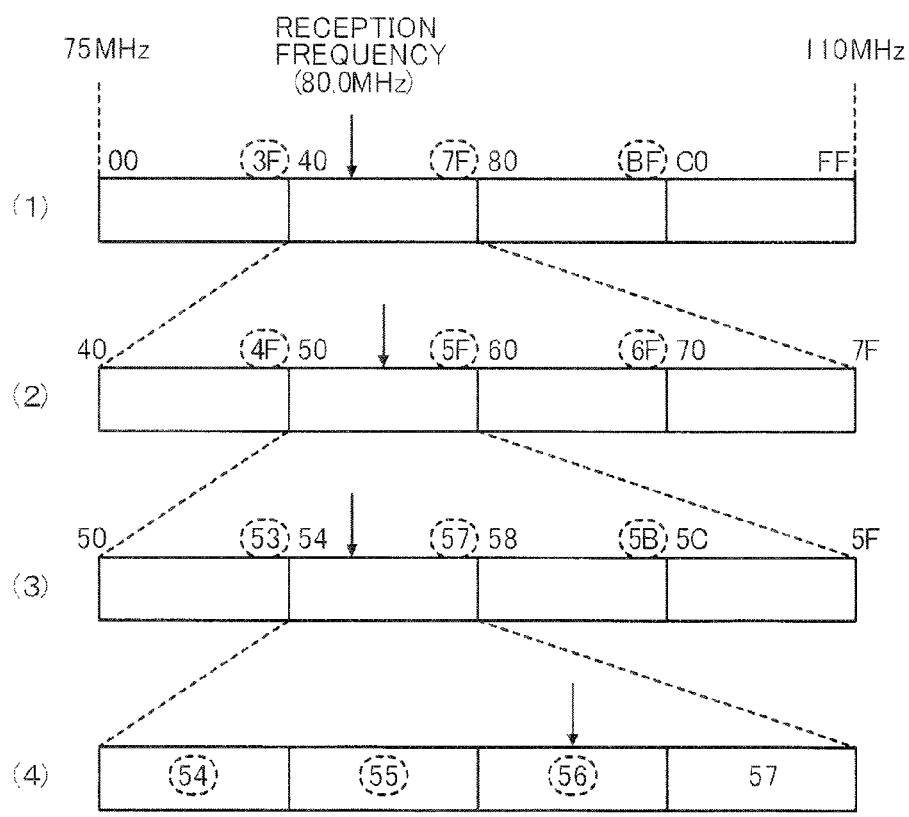
FIG. 6 is a diagram of an example of adjustment steps of a control signal when a desired reception frequency is 80.0 MHz.

Operation of adjusting the oscillation frequency in the FM radio receiver 1 will be described. First, an outline of the adjustment process of the control signal will be described based on a specific example. FIG. 6 is a diagram of an example of adjustment steps of the control signal output to the register 53 of the high-frequency tuning circuit 11 when the desired reception frequency is 80.0 MHz.

Since the control signal is eight bits in this embodiment, the variable range of the control signal is 0X00 to 0XFF in the initial state. The variable range dividing unit 90 divides this variable range into four blocks (portions), for example. That is, as shown in FIG. 6(1), the variable range is divided into four blocks of 0x00 to 0x3F, 0x40 to 0x7F, 0x80 to 0xBF, and 0xC0 to 0xFF.

The determining unit 95 outputs the control signal indicating a boundary of each block divided by the variable range dividing unit 90 and determines a block including the control signal setting the tuning frequency to the desired reception frequency. For example, the determining unit 95 sequentially outputs 0x3F, 0x7F, and 0xBF, which are control signals indicating the boundaries of the blocks, until the tuning frequency is set to the desired reception frequency. Since the tuning frequency is less than 80.0 MHz when outputting the control signal 0x3F in the example of FIG. 6(1), the determining unit 95 subsequently outputs the control signal 0x7F. Since the tuning frequency is greater than 80.0 MHz when outputting the control signal 0x7F, the determining unit 95 determines that a second block from the left is the block including the control signal setting the tuning frequency to 80.0 MHz.

If the determining unit 95 determines the block including the control signal setting the tuning frequency to 80.0 MHz, the variable range dividing unit 90 further divides the block into four blocks, for example. That is, as shown in FIG. 6(2), the block is divided into four blocks of 0x40 to 0x4F, 0x50 to 0x5F, 0x60 to 0x6F, and 0x70 to 0x7F.

The determining unit 95 sequentially outputs the control signals 0x4F, 0x5F, and 0x6F that indicate boundaries of the blocks divided by the variable range dividing unit 90 and determines a block including the control signal setting the tuning frequency to the desired reception frequency. Since the tuning frequency is less than 80.0 MHz when outputting the control signal 0x4F in the example of FIG. 6(2), the determining unit 95 subsequently outputs the control signal 0x5F. Since the tuning frequency is greater than 80.0 MHz when outputting the control signal 0x5F, the determining unit 95 determines that a second block from the left is the block including the control signal setting the tuning frequency to 80.0 MHz.

The variable range dividing unit 90 further divides the block into four blocks, for example. That is, as shown in FIG. 6(3), the block is divided into four blocks of 0x50 to 0x53, 0x54 to 0x57, 0x58 to 0x5B, and 0x5C to 0x5F.

The determining unit 95 sequentially outputs the control signals 0x53, 0x57, and 0x5B that indicate boundaries of the blocks divided by the variable range dividing unit 90 and determines a block including the control signal setting the tuning frequency to the desired reception frequency. Since the tuning frequency is less than 80.0 MHz when outputting the control signal 0x53 in the example of FIG. 6(3), the determining unit 95 subsequently outputs the control signal 0x57. Since the tuning frequency is greater than 80.0 MHz when outputting the control signal 0x57, the determining unit 95 determines that a second block from the left is the block including the control signal setting the tuning frequency to 80.0 MHz.

The variable range dividing unit 90 further divides the block into four blocks, for example. That is, as shown in FIG. 6(4), the block is divided into four blocks of 0x54, 0x55, 0x56, and 0x57.

The determining unit 95 sequentially outputs the control signals 0x54, 0x55, and 0x56 that indicate boundaries of the blocks divided by the variable range dividing unit 90 and determines a block including the control signal setting the tuning frequency to the desired reception frequency. Since the tuning frequency is less than 80.0 MHz when outputting the control signal 0x55 in the example of FIG. 6(4), the determining unit 95 subsequently outputs the control signal 0x56. Since the tuning frequency is greater than 80.0 MHz when outputting the control signal 0x56, the determining unit 95 determines that a third block from the left, i.e., the control signal 0x56 is the block including the control signal setting the tuning frequency to 80.0 MHz.

In this way, the variable range dividing unit 90 uses the block determined by the determining unit 95 as a variable range and repeatedly divides the variable range until the tuning frequency is set to the reception frequency. Although the example of FIG. 6 shows an example of adjusting the value of the control signal output to the register 53 of the high-frequency tuning circuit 11, adjustment is performed in the same procedure for the values of the control signals output to the register 54 of the high-frequency tuning circuit 11, the register 64 of the local oscillation circuit 13, and the register 74 of the oscillation circuit 18.

Figure 7:
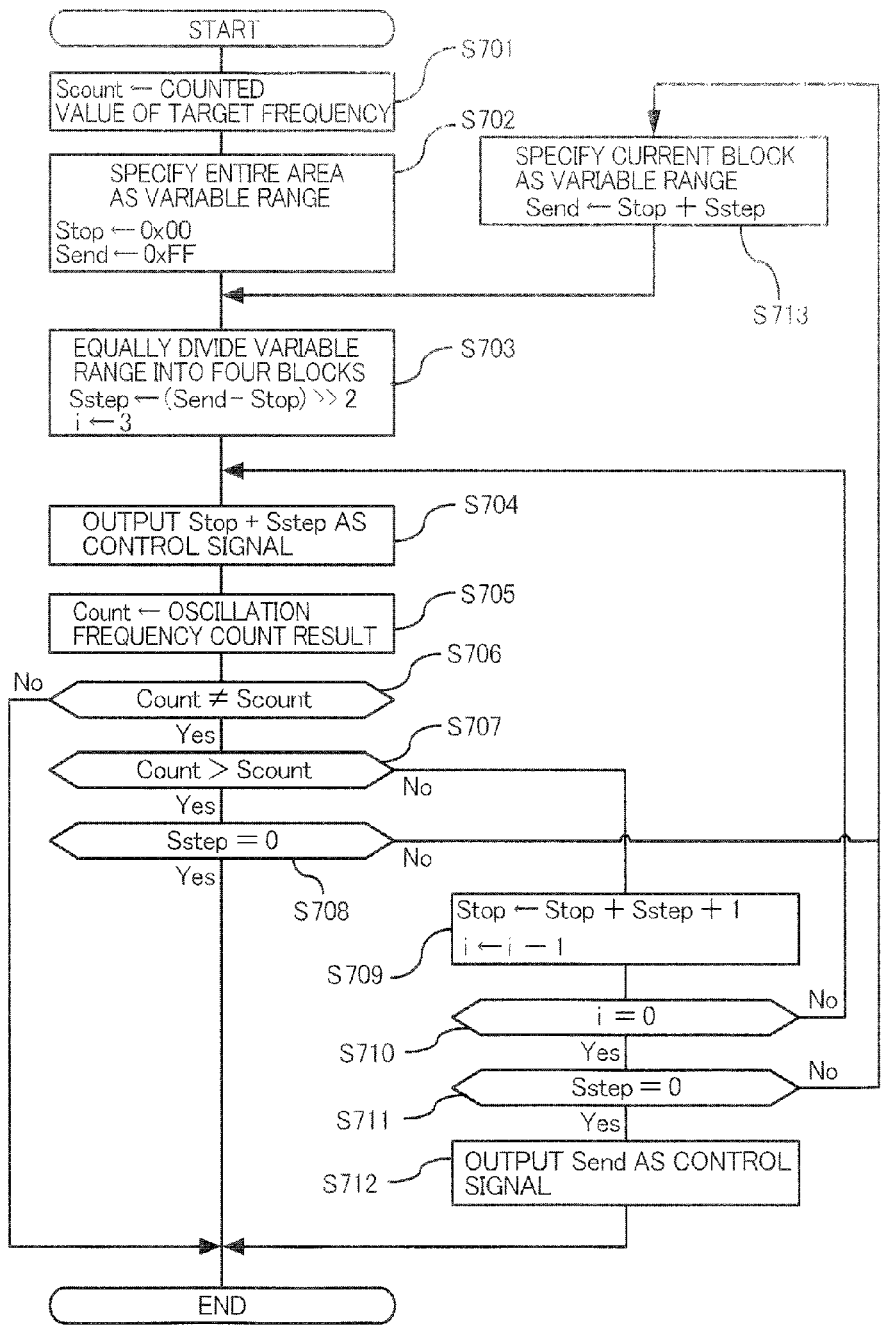
FIG. 7 is a flowchart of an adjustment process of a control signal.

Details of the adjustment process of the control signal will be described with reference to a flowchart. FIG. 7 is a flowchart of the adjustment process of the control signal. An example of adjusting the control signal output to the register 53 of the high-frequency tuning circuit 11 will be described here.

Since the counted number indicating the target frequency is constant, the variable range dividing unit 90 sets this counted number as a constant number $S_{count}$ (S701). The variable range dividing unit 90 sets 0x00 as a variable $S_{top}$ indicating the beginning of the variable range of the control signal and sets 0xFF as a variable $S_{end}$ indicating the end of the variable range (S702). As a result, the entire range of 0x00 to 0xFF is specified as the variable range of the control signal.

The variable range dividing unit 90 then sets a value obtained by shifting $S_{end}$-$S_{top}$, for example, by two bits to the right as a variable $S_{step}$ indicating a division width of the variable range and sets a default value of three as a variable i (S703). That is, the variable range is shifted by two bits to the right to set the division width to ¼ of the variable range, and the variable range is divided into four blocks.

The determining unit 95 outputs $S_{top}$+$S_{step}$ as the control signal to the register 53 of the high-frequency tuning circuit 11 (S704). That is, the control signal indicating the block boundary is output. The determining unit 95 sets the counted number output from the counter 25 at this point as a variable Count indicating the count result of the oscillation frequency (S705).

The determining unit 95 checks whether Count is identical to $S_{count}$ (S706). That is, it is checked whether the oscillation frequency is identical to the target frequency. If Count is identical to $S_{count}$ (S706: No), the determining unit 95 determines that the control signal output to the register 53 at this point is the control signal setting the oscillation frequency to the target frequency and the process is terminated.

If Count is not identical to $S_{count}$ (S706: Yes), the determining unit 95 checks whether Count is larger than $S_{count}$ (S707). If Count is larger than $S_{count}$ (S707: Yes), the determining unit 95 checks whether $S_{step}$ is zero, that is, whether the block is divided into minimum units (S708). If $S_{step}$ is zero (S708: Yes), the determining unit 95 determines that the control signal output to the register 53 at this point is the control signal setting the oscillation frequency to the target frequency and the process is terminated.

If Count is smaller than $S_{count}$ (S707: No), the determining unit 95 sets $S_{top}$+$S_{step}$+1 as $S_{top}$ and subtracts one from i (S709). The determining unit 95 determines whether i is zero (S710), and if i is not zero (S710: No), the determining unit 95 returns to a process of outputting the control signal of the next block boundary (S704). That is, the process of outputting the control signal of the block boundary is repeatedly performed until the oscillation frequency is set to the target frequency or greater (S704 to S710). If i is zero (S710: Yes), the determining unit 95 checks whether $S_{step}$ is zero, that is, whether the block is divided into minimum units (S711). If $S_{step}$ is zero (S711: Yes), the determining unit 95 determines that $S_{end}$ is the control signal setting the oscillation frequency to the target frequency and outputs $S_{end}$ as the control signal to the register 53 (S712), and the process is terminated.

If $S_{step}$ is not zero (S708: No and S711: No), the variable range dividing unit 90 sets $S_{top}$+$S_{step}$ as $S_{end}$ (S713). That is, a new variable range is set to a block determined by the determining unit 95 as a block including the control signal setting the oscillation frequency to the target frequency.

The variable range dividing unit 90 divides the new variable range into four blocks (S703). The determining unit 95 repeatedly performs the above process (S704 to S712) for the newly divided four blocks. The value of the control signal corresponding to the target frequency is identified by repeatedly performing the variable range division process and the process of determining the block including the control signal setting the oscillation frequency to the target frequency.

Although the process of adjusting the control signal output to the register 53 has been described, the adjustment process is performed in the same procedure for the control signals output to the register 54 of the high-frequency tuning circuit 11, the register 64 of the local oscillation circuit 13, and the register 74 of the oscillation circuit 18.

An embodiment of the present invention has been described. By repeatedly performing the division process of the variable range of the control signal and the process of determining the block including the control signal setting the oscillation frequency to the target frequency as described above, the value of the control signal setting the oscillation frequency to the target frequency can be identified more quickly than the method of changing the value of the control signal stepwise within the variable range and the method using the linear approximation. For example, in the example shown in FIG. 6, while the value of the control signal must be changed up to 255 times in the method of changing the value of the control signal stepwise within the variable range, the value of the control signal is changed at most 12 times in this embodiment.

As shown in FIGS. 6 and 7, since the division number of the variable range is fixed (to four, in this embodiment), one division process can recursively be used. Therefore, the number of steps is reduced in the program adjusting the control signal, and a capacity can be reduced in a memory necessary for storing the program.

By identifying the value of the control signal setting the tuning frequency of the high-frequency tuning circuit 11 to the target frequency in accordance with the process shown in FIG. 7, the signal having the reception frequency can quickly be extracted from the FM reception signals received from the antenna 10. Since a PLL circuit is not necessary for adjusting the tuning frequency, a circuit scale can be reduced.

Similarly, by identifying the value of the control signal setting the oscillation frequency of the local oscillation circuit 13 to the target frequency in accordance with the process shown in FIG. 7, the oscillation signal necessary for generating the intermediate frequency signal can quickly be generated. Since a PLL circuit is not necessary for adjusting the oscillation frequency, a circuit scale can be reduced.

By identifying the value of the control signal setting the oscillation frequency of the oscillation circuit 18 to the target frequency in accordance with the process shown in FIG. 7, the oscillation signal necessary for the stereo demodulation process can quickly be generated. Since a PLL circuit is not necessary for adjusting the oscillation frequency, a circuit scale can be reduced.

The above embodiments of the present invention are simply for facilitating the understanding of the present invention and are not in any way to be construed as limiting the present invention. The present invention may variously be changed or altered without departing from its spirit and encompass equivalents thereof.

Although the adjustment of the oscillation frequency of the oscillation circuit included in, for example, the FM radio receiver 1 has been described in an embodiment, the oscillation frequency can also be adjusted in an oscillation circuit included in an AM radio receiver as is the case with this embodiment.

Although the control signal is, for example, eight bits in an embodiment, the control signal may be other than eight bits.

Although the variable range of the control signal is divided, for example, into four in an embodiment, the division number of the variable range may be other than four.

It is claimed:

1. An oscillation controlling apparatus configured to control an oscillation frequency of an oscillation circuit to be a target frequency, comprising:
    a variable range dividing unit configured to divide a variable range of a control signal into a plurality of portions, the control signal increasing or decreasing the oscillation frequency of the oscillation circuit as a value thereof is increased or decreased; and
    a determining unit configured to determine the portion including the control signal setting the oscillation frequency to the target frequency, by outputting the control signal at a boundary of each portion divided by the variable range dividing unit and by acquiring the oscillation frequency of the oscillation circuit, wherein
    the variable range dividing unit is configured to divide repeatedly the variable range until the oscillation frequency of the oscillation circuit is set to the target frequency with using the portion determined by the determining unit as the variable range.

2. The oscillation controlling apparatus of claim 1, wherein the variable range dividing unit is configured to divide the variable range into a predetermine number of portions.

3. The oscillation controlling apparatus of claim 1, wherein the oscillation circuit is a tuning circuit configured to extract a signal having the target frequency from FM reception signals or AM reception signals.

4. The oscillation controlling apparatus of claim 2, wherein the oscillation circuit is a tuning circuit configured to extract a signal having the target frequency from FM reception signals or AM reception signals.

5. The oscillation controlling apparatus of claim 1, wherein the oscillation circuit is a local oscillation circuit configured to output a signal having the target frequency corresponding to a reception frequency, which is mixed with a signal having the reception frequency extracted from FM reception signals or AM reception signals to generate an intermediate frequency signal.

6. The oscillation controlling apparatus of claim 2, wherein the oscillation circuit is a local oscillation circuit configured to output a signal having the target frequency corresponding to a reception frequency, which is mixed with a signal having the reception frequency extracted from FM reception signals or AM reception signals to generate an intermediate frequency signal.

7. The oscillation controlling apparatus of claim 1, wherein the oscillation circuit is configured to output a signal having the target frequency corresponding to a pilot signal included in a FM-detected stereo composite signal to generate right and left audio signals from the FM-detected stereo composite signal.

8. The oscillation controlling apparatus of claim 2, wherein the oscillation circuit is configured to output a signal having the target frequency corresponding to a pilot signal included in a FM-detected stereo composite signal to generate right and left audio signals from the FM-detected stereo composite signal.

9. A recording medium having recorded thereon a program of controlling an oscillation frequency of an oscillation circuit to be a target frequency, the program driving a processor to execute the steps of:
    dividing a variable range of a control signal into a plurality of portions, the control signal increasing or decreasing the oscillation frequency of the oscillation circuit as a value thereof is increased or decreased;
    outputting the control signal at a boundary of each divided portion of the variable range;
    determining the portion including the control signal setting the oscillation frequency to the target frequency by acquiring the oscillation frequency of the oscillation circuit; and
    dividing repeatedly the variable range until the oscillation frequency of the oscillation circuit is set to the target frequency with using the determined portion as the variable range.

10. The recording medium having the program recorded thereon of claim 9, wherein
    the step of dividing the variable range into a plurality of portions is a step of dividing the variable range into a predetermine number of portions.

11. The recording medium having the program recorded thereon of claim 9, wherein
the oscillation circuit is a tuning circuit configured to extract a signal having the target frequency from FM reception signals or AM reception signals.

12. The recording medium having the program recorded thereon of claim 10, wherein
the oscillation circuit is a tuning circuit configured to extract a signal having the target frequency from FM reception signals or AM reception signals.

13. The recording medium having the program recorded thereon of claim 9, wherein
the oscillation circuit is a local oscillation circuit configured to output a signal having the target frequency corresponding to a reception frequency, which is mixed with a signal having the reception frequency extracted from FM reception signals or AM reception signals to generate an intermediate frequency signal.

14. The recording medium having the program recorded thereon of claim 10, wherein
the oscillation circuit is a local oscillation circuit configured to output a signal having the target frequency corresponding to a reception frequency, which is mixed with a signal having the reception frequency extracted from FM reception signals or AM reception signals to generate an intermediate frequency signal.

15. The recording medium having the program recorded thereon of claim 9, wherein
the oscillation circuit is configured to output a signal having the target frequency corresponding to a pilot signal included in a FM-detected stereo composite signal to generate right and left audio signals from the FM-detected stereo composite signal.

16. The recording medium having the program recorded thereon of claim 10, wherein
the oscillation circuit is configured to output a signal having the target frequency corresponding to a pilot signal included in a FM-detected stereo composite signal to generate right and left audio signals from the FM-detected stereo composite signal.

17. A channel selecting apparatus comprising:
a tuning circuit configured to oscillate at an oscillation frequency corresponding to an input control signal to extract a signal having the oscillation frequency from FM reception signals or AM reception signals; and
an oscillation controlling apparatus configured to control the oscillation frequency of the tuning circuit to be a reception frequency, wherein
the oscillation controlling apparatus includes
a variable range dividing unit configured to divide a variable range of the control signal into a plurality of portions, the control signal increasing or decreasing the oscillation frequency of the tuning circuit as a value thereof is increased or decreased, and
a determining unit configured to determine the portion including the control signal setting the oscillation frequency to the reception frequency, by outputting the control signal at a boundary of each portion divided by the variable range dividing unit and by acquiring the oscillation frequency of the oscillation circuit, and wherein
the variable range dividing unit configured to divide repeatedly the variable range until the oscillation frequency of the tuning circuit is set to the reception frequency with using the portion determined by the determining unit as the variable range.

18. The channel selecting apparatus of claim 17, further comprising:
a local oscillation circuit configured to output a local oscillation signal having an oscillation frequency corresponding to the input control signal; and
a mixing circuit configured to mix the signal having the reception frequency output from the tuning circuit and the local oscillation signal corresponding to the reception frequency output from the local oscillation circuit to generate an intermediate frequency signal, wherein
the variable range dividing unit is configured to divide a variable range of the control signal into a plurality of portions, the control signal increasing or decreasing the frequency of the local oscillation signal as a value thereof is increased or decreased, wherein
the determining unit is configured to determine the portion including the control signal setting the frequency of the local oscillation signal to the frequency corresponding to the reception frequency by outputting the control signal at a boundary of each portion divided by the variable range dividing unit and by acquiring the frequency of the local oscillation signal, and wherein
the variable range dividing unit is configured to divide repeatedly the variable range until the frequency of the local oscillation signal is set to the frequency corresponding to the reception frequency with using the portion determined by the determining unit as the variable range.

19. The channel selecting apparatus of claim 18, further comprising:
an FM detection circuit configured to perform FM detection of the intermediate frequency signal to output a stereo composite signal;
an oscillation circuit configured to output a signal having an oscillation frequency corresponding to the input control signal; and
a stereo demodulation circuit configured to generate right and left audio signals based on the stereo composite signal output from the FM detection circuit and the signal output from the oscillation circuit, which has a frequency corresponding to a frequency of a pilot signal included in the stereo composite signal, wherein
the variable range dividing unit is configured to divide a variable range of the control signal into a plurality of portions, the control signal increasing or decreasing the oscillation frequency of the oscillation circuit as a value thereof is increased or decreased, wherein
the determining unit is configured to determine the portion including the control signal setting the oscillation frequency of the oscillation circuit to the frequency corresponding to the frequency of the pilot signal by outputting the control signal at a boundary of each portion divided by the variable range dividing unit and by acquiring the oscillation frequency of the oscillation circuit, and wherein
the variable range dividing unit is configured to divide repeatedly the variable range until the oscillation frequency of the oscillation circuit is set to a frequency corresponding to the frequency of the pilot signal with using the portion determined by the determining unit as the variable range.

* * * * *